(12) United States Patent
Matsumoto

(10) Patent No.: US 7,272,770 B2
(45) Date of Patent: *Sep. 18, 2007

(54) METHOD AND APPARATUS FOR GENERATING CHECK MATRIX

(75) Inventor: Wataru Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/520,061

(22) PCT Filed: Feb. 27, 2004

(86) PCT No.: PCT/JP2004/002399

§ 371 (c)(1),
(2), (4) Date: Jan. 5, 2005

(87) PCT Pub. No.: WO2004/077680

PCT Pub. Date: Sep. 10, 2004

(65) Prior Publication Data

US 2005/0251724 A1 Nov. 10, 2005

(30) Foreign Application Priority Data

Feb. 28, 2003 (JP) ............................. 2003-053162

(51) Int. Cl.
*H03M 13/00* (2006.01)
(52) U.S. Cl. ........................................ 714/752
(58) Field of Classification Search .............. 714/758, 714/801
See application file for complete search history.

(56) References Cited

U.S. PATENT DOCUMENTS 6,757,122 B1 * 6/2004 Kuznetsov et al. ........... 360/53

6,789,227 B2 * 9/2004 De Souza et al. .......... 714/804

(Continued)

FOREIGN PATENT DOCUMENTS

JP 2003-115768 A 4/2003

(Continued)

OTHER PUBLICATIONS

Matsumoto, Imai, Ketteironteki Hiseisoku LDPC Fugo Sekkeiho, 2002 Nen The Institute of Electronics, Information and Communication Engineers Kiso Kyokai Society Taikai, A-6-12, Sep. 10-13, 2002, p. 126.

(Continued)

*Primary Examiner*—Guy Lamarre
*Assistant Examiner*—Sam Rizk
(74) *Attorney, Agent, or Firm*—Birch, Stewart, Kolasch & Birch, LLP

(57) ABSTRACT

A method of generating a check matrix for an LDPC code includes determining a coding rate, generating a basic matrix that satisfies predetermined conditions, determining a number of columns of a check matrix, substituting rows of the basic matrix based on a specific relational equation, provisionally searching an ensemble of weights by executing Gaussian approximation, deleting rows of the basic matrix after the permutation in order from the bottom by considering the number of rows after a division, searching an optimal ensemble of weights by executing Gaussian approximation based on a predetermined condition after row deletion, and dividing at random the weights of the basic matrix after the row deletion based on the optimal ensemble.

13 Claims, 10 Drawing Sheets

U.S. PATENT DOCUMENTS

2003/0037298 A1 2/2003 Eleftheriou et al.
2004/0186992 A1* 9/2004 Matsumoto .................. 713/161

FOREIGN PATENT DOCUMENTS

| JP | 2003-198383 A | 7/2003 |
|---|---|---|
| WO | 03-056705 A1 | 7/2003 |
| WO | 03/073621 A1 | 9/2003 |
| WO | 2004/006444 A1 | 1/2004 |

OTHER PUBLICATIONS

"Low Density Parity-Check Codes", Robert G. Gallager, Cambridge, MA. Jul. 1963, pp. 2-90.

"Low-Density Parity-Check Codes Based on Finite Geometries: A Rediscovery and New Results" IEEE Trans. on Inf. vol. 47, No. 7. Nov. 2001, pp. 2711-2734.

"Improved Low-Density Parity-Check Codes Using Irregular Graphs and Belief Propagation" ISIT 1998. pp. 171.

"The Capacity of Low-Density Parity-Check Codes Under Message-Passing Decoding", IEEE Trans. Inform. Theory vol. 47, No. 2. Feb. 2001, pp. 1-42.

"Analysis of Sum-Product Decoding of Low-Density Parity-Check Codes Using a Gaussian Approximation", IEEE Trans. Inform. Theory, vol. 47, No. 2. pp. 657-670, Feb. 2001.

Vasic et al., "Lattice Low-Density Parity Check Codes and Their Application in Partial Response Systems" *ISIT*, p. 453 (2002).

Matsumoto et al., "Irregular extended Euclidean geometry low-density parity-check codes" *International Symposium on Communication Systems Networks and Digital Signal Processing*, pp. 148-151 (2002).

Matsumoto et al., "Irregular Low-Density Parity-Check Code Design Based on Euclidean Geometries" *IEICE Trans. Fundamentals*, vol. E86-A, No. 7 (2003).

Matsumoto et al., "Irregular Low-Density Parity-Check Code Design Based on Integer Lattices" *ISIT*, p. 3 (2003).

Rosenthal et al., "Constructions of Regular and Irregular LDPC Codes Using Ramanujan Graphs and Ideas from Margulis" *ISIT*, p. 4, (2001).

Vontobel et al., "Irregular Codes from Regular Graphs" *ISIT*, p. 284 (2002).

Chiani et al., "Design and Performance Evaluation of Some High-Rate Irregular Low-Density Parity-Check Codes" *IEEE Global Telecommunications Conference*, pp. 990-994 (2001).

Rosenthal et al., "Constructions of LDPC Codes Using Ramanujan Graphs and Ideas from Margulis" *Proc., 38th Allerton Conference on Communication*, pp. 1-10 (2000).

Chung et al., "Analysis of Sun-Product Decoding of Low-Density Parity-Check Codes Using a Gaussian Approximation" *IEEE Trans., on Information Theory*, vol. 47, No. 2, pp. 657-670.

* cited by examiner

FIG.4

|  | s=0 | s=1 | s=2 | s=3 | s=4 |
|---|---|---|---|---|---|
| CLASS | {1,6,11} | {1,7,13} | {1,8,15} | {1,9,12} | {1,10,14} |
|  | {2,7,12} | {2,8,14} | {2,9,11} | {2,10,13} | {2,6,15} |
|  | {3,8,13} | {3,9,15} | {3,10,12} | {3,6,14} | {3,7,11} |
|  | {4,9,14} | {4,10,11} | {4,6,13} | {4,7,15} | {4,8,12} |
| BLOCK | {5,10,15} | {5,6,12} | {5,7,14} | {5,8,11} | {5,9,13} |

FIG.5

$s=0$, $S=\{s\}$, $B'=B(s)$, $S'=\{1,2,\ldots,m-1\}$.
While $S' \neq$ empty set
$s=s+1$
  if $g(V, B' \cup B(s))=8$
    $S=S \cup \{s\}$
    $S'=S' \setminus \{s\}$
    $B'=B' \cup B(s)$
  else
    $S'=S' \setminus \{s\}$
  end
end

FIG.6

| k | m | S | N=|B| | M=|V| | (dv,dc) |
|---|---|---|---|---|---|
| 3 | 5 | 0,1 | 10 | 15 | (3,2) |

FIG.7

$$\begin{array}{c} p_1 \\ p_2 \\ p_3 \\ p_4 \\ p_5 \\ p_6 \\ p_7 \\ p_8 \\ p_9 \\ p_{10} \\ p_{11} \\ p_{12} \\ p_{13} \\ p_{14} \\ p_{15} \end{array} \begin{pmatrix} 1 & 0 & 0 & 0 & 0 & 1 & 0 & 0 & 0 & 0 \\ 0 & 1 & 0 & 0 & 0 & 0 & 1 & 0 & 0 & 0 \\ 0 & 0 & 1 & 0 & 0 & 0 & 0 & 1 & 0 & 0 \\ 0 & 0 & 0 & 1 & 0 & 0 & 0 & 0 & 1 & 0 \\ 0 & 0 & 0 & 0 & 1 & 0 & 0 & 0 & 0 & 1 \\ 1 & 0 & 0 & 0 & 0 & 0 & 0 & 0 & 0 & 1 \\ 0 & 1 & 0 & 0 & 0 & 1 & 0 & 0 & 0 & 0 \\ 0 & 0 & 1 & 0 & 0 & 0 & 1 & 0 & 0 & 0 \\ 0 & 0 & 0 & 1 & 0 & 0 & 0 & 1 & 0 & 0 \\ 0 & 0 & 0 & 0 & 1 & 0 & 0 & 0 & 1 & 0 \\ 1 & 0 & 0 & 0 & 0 & 0 & 0 & 0 & 1 & 0 \\ 0 & 1 & 0 & 0 & 0 & 0 & 0 & 0 & 0 & 1 \\ 0 & 0 & 1 & 0 & 0 & 1 & 0 & 0 & 0 & 0 \\ 0 & 0 & 0 & 1 & 0 & 0 & 1 & 0 & 0 & 0 \\ 0 & 0 & 0 & 0 & 1 & 0 & 0 & 1 & 0 & 0 \end{pmatrix}$$

FIG.8

| k | m | S | N=|B| | M=|V| | (dv,dc) |
|---|---|---|---|---|---|
| 10 | 353 | 0,1,10,11,23,24,224 | 2471 | 3530 | (10,7) |

FIG.9 for $i = 1$ to $|V|$ $R_{k*((i-1) \bmod m) + \lfloor (i-1)/m \rfloor + 1} = R_i$ end

FIG.10

$$\begin{pmatrix}
1 & 0 & 0 & 0 & 0 & 1 & 0 & 0 & 0 & 0 \\
1 & 0 & 0 & 0 & 0 & 0 & 0 & 0 & 0 & 1 \\
1 & 0 & 0 & 0 & 0 & 0 & 0 & 0 & 1 & 0 \\
0 & 1 & 0 & 0 & 0 & 0 & 1 & 0 & 0 & 0 \\
0 & 1 & 0 & 0 & 0 & 1 & 0 & 0 & 0 & 0 \\
0 & 1 & 0 & 0 & 0 & 0 & 0 & 0 & 0 & 1 \\
0 & 0 & 1 & 0 & 0 & 0 & 0 & 1 & 0 & 0 \\
0 & 0 & 1 & 0 & 0 & 0 & 1 & 0 & 0 & 0 \\
0 & 0 & 1 & 0 & 0 & 1 & 0 & 0 & 0 & 0 \\
0 & 0 & 0 & 1 & 0 & 0 & 0 & 0 & 1 & 0 \\
0 & 0 & 0 & 1 & 0 & 0 & 0 & 1 & 0 & 0 \\
0 & 0 & 0 & 1 & 0 & 0 & 1 & 0 & 0 & 0 \\
0 & 0 & 0 & 0 & 1 & 0 & 0 & 0 & 0 & 1 \\
0 & 0 & 0 & 0 & 1 & 0 & 0 & 0 & 1 & 0 \\
0 & 0 & 0 & 0 & 1 & 0 & 0 & 1 & 0 & 0
\end{pmatrix}$$

FIG.11

| Rate | 0.5 | | |
|---|---|---|---|
| | x | $\lambda x$ | No. |
| | 2 | 0.28647619 | 3008 |
| | 3 | 0.264571429 | 1852 |
| | 4 | 0.001142857 | 6 |
| | 6 | 0.138285714 | 484 |
| | 10 | 0.30952381 | 650 |
| | x | $\rho x$ | No. |
| | 7 | 1 | 3000 |
| $\sigma$GA | | | 0.940358043 |

METHOD AND APPARATUS FOR GENERATING CHECK MATRIX

TECHNICAL FIELD

The present invention relates to a method and an apparatus for generating a check matrix for a low-density parity-check (LDPC) code that is applied as an error correcting code, and more particularly, to a method and an apparatus for generating a check matrix capable of searching a definite and characteristic-stabilized check matrix for the LDPC code.

BACKGROUND ART

A conventional method of generating check matrixes for LDPC codes will be explained below. In a conventional LDPC code encoding/decoding system, a communication apparatus at a sending side has an encoder and a modulator. On the other hand, an apparatus at a receiving side has a demodulator and a decoder. Prior to explanation of the conventional method of generating check matrixes for LDPC codes, flows of encoding and decoding using LDPC codes are explained first.

At the sending side, the encoder generates a check matrix H according to the conventional method described later. Then, a generator matrix G is obtained based on the following condition.

G: k×n matrix (k: information length, n: code word length)

$GH^T=0$ (T denotes transposition)

The encoder then receives a message $(m_1 m_2 \ldots m_k)$ of an information length k, and generates a code word C using the generator matrix G.

$$C = (m_1 m_2 \ldots m_k) G$$
$$= (c_1 c_2 \ldots c_n)(\text{where } H(c_1 c_2 \ldots c_n)^T = 0)$$

The modulator subjects the generated code word C to a digital modulation such as binary phase shift keying (BPSK), quadrature phase shift keying (QPSK), and multi-valued quadrature amplitude modulation (QAM), and sends the modulated signal.

At the receiving side on the other hand, the demodulator receives the modulated signal via the channel, and subjects it to a digital demodulation such as BPSK, QPSK, and multi-valued QAM. Then the decoder performs an iterative decoding by "sum-product algorithm" with respect to the demodulated result that is LDPC-coded, and outputs an estimated result (corresponding to the original $m_1 m_2 \ldots m_k$).

A conventional method of generating check matrixes for LDPC codes is explained below. As a check matrix for LDPC codes, the following matrix is proposed in "R. G. Gallager, "Low-Density Parity Check Codes"M.I.T Press, Cambridge. Mass., 1963" (see FIG. 16).

The matrix shown in FIG. 16 is a binary matrix of "1" and "0", in which a part of "1" is hatched. Other parts are all "0". In this matrix, the number of "1"s in one row (expressed as a row weight) is equal to 4, and the number of "1"s in one column (expressed as a column weight) is equal to three. All columns and rows have respective uniform weights. Thus, it is generally called a "regular-LDPC code". In the codes in the Non-patent Literature 1, the matrix is separated into three blocks, for example, and the second and the third blocks are subjected to random permutation, as shown in FIG. 16.

Because the random permutation has no certain rule, it is required to execute a time-consuming search by a computer to find codes with a better characteristic.

It is proposed in Y. Kou, S. Lin, and M. P. C. Fossorier, "Low Density Parity Check Codes Based on Finite Geometries: A Rediscovery", ISIT 2000, pp. 200, Sorrento, Italy, Jun. 25-30, 2000 a method using Euclidean geometry codes as the LDPC codes that exhibit a relatively stable and satisfactory characteristic and can definitely generate a matrix without the use of the computer search. This method explains the "regular-LDPC code" consisting of regular ensembles.

The second literature proposes a method of generating a check matrix for LDPC codes using Euclidean geometry codes EG $(2, 2^6)$ as a kind of finite geometric codes. This method achieves a characteristic that is located closely but 1.45 decibels away from the Shannon limit at an error rate of $10^{-4}$. FIG. 17 is a diagram of a configuration of Euclidean geometry codes EG $(2, 2^2)$, which has a structure of "Regular-LDPC Codes" with row and column weights of 4 and 4, respectively.

Euclidean geometry codes EG $(m, 2^s)$ have a characteristic defined as follows:

Code length: $n=2^{2s}-1$

Redundant bit length: $n-k=3^s-1$

Information length: $k=2^{2s}-3^s$

Minimum distance: $d_{min}=2^s+1$

Density: $r=2^s/(2^{2s}-1)$.

As can be seen from FIG. 17, Euclidean geometry codes have a structure with a cyclically sifted location of "1" in each row from an adjacent row. This structure can characteristically configure codes easily and definitely.

The check matrix generating method in the second literature further includes changing row and column weights based on the Euclidean geometry codes to extend rows and columns, if necessary. For example, when a column weight in EG $(2, 2^2)$ is separated into halves, in the second literature, every other one of four weights located in one column is separated into two groups. FIG. 18 is a diagram of an exemplary regular separation of the column weight from 4 into 2.

On the other hand, M. G. Luby, M. Mitzenmacher, M. A. Shokrollahi, and D. A. Spielman, "Improved Low-Density Parity-Check Codes Using Irregular Graphs and Belief Propagation", Proceedings of 1998 IEEE International Symposium on Information Theory, pp. 171, Cambridge, Mass., Aug. 16-21, 1998 has reported that "irregular-LDPC codes" have a better characteristic than that of "Regular-LDPC Codes". This is theoretically analyzed in T. J. Richardson and R. Urbanke, "The capacity of low-density parity-check codes under message-passing decoding", IEEE Trans. Inform. Theory, vol. 47, No. 2, pp. 599-618, February 2001 and S.-Y. Chung, T. J. Richardson, and R. Urbanke, "Analysis of Sum-Product Decoding of Low-Density Parity-Check Codes Using a Gaussian Approximation", IEEE Trans. Inform. Theory, vol. 47, No. 2, pp. 657-670, February 2001. The "irregular-LDPC codes" represent such LDPC codes that have non-uniformity in either or both of row and column weights.

Particularly, in the fifth literature, a "Sum-Product Algorithm" for LDPC codes is analyzed on the assumption that a log likelihood ratio (LLR) between an input and an output at an iterative decoder can be approximated in a Gaussian distribution, to derive a satisfactory ensemble of row and column weights.

According to the conventional method of generating check matrixes for LDPC codes disclosed in the fifth literature, however, the number of "1" points in a row (corresponding to a degree distribution of variable nodes described later) and the number of "1" points in a column (corresponding to a degree distribution of check nodes described later) are both employed as variables to derive the degree distribution of variable nodes and the degree distribution of check nodes that can maximize the following equation (1) (rate: coding rate). In other words, a linear programming is employed to search an ensemble that minimizes a Signal to Noise Ratio (SNR).

$$\text{rate} = 1 - \frac{\int_0^1 \rho(x)}{\int_0^1 \lambda(x)} \quad (1)$$

Therefore, a problem arises that a check matrix derived from the maximum of the "rate" has a flux and unstable characteristic. In addition, the conventional method of generating check matrixes for LDPC codes iteratively executes the derivation of the degree distribution of variable nodes and the derivation of the degree distribution of check nodes over certain times. Therefore, a problem arises that it takes time to some extent for searching.

The present invention has been achieved in consideration of the above problems, and accordingly has an object to provide a method of generating check matrixes for LDPC codes having satisfactory performance capable of easily searching a definite and characteristic stabilized check matrix for LDPC codes corresponding to an optimal ensemble, and a check matrix generating apparatus.

DISCLOSURE OF THE INVENTION

In order to solve the above problems and to achieve the object, a method of generating a check matrix according to the present invention includes determining a coding rate, generating a basic matrix that satisfies conditions that "weights of rows and columns are constant" and "number of cycles is equal to or more than six", determining number of columns and number of rows of the check matrix to be finally obtained, substituting rows of the basic matrix created, based on a specific relational equation, searching provisionally an ensemble of row weights and column weights of the low-density parity check code by executing a Gaussian approximation based on a predetermined condition before a row deletion, deleting rows of the basic matrix after the substituting in order from a bottom by considering the number of rows after a division, that is, the number of rows of the check matrix to be finally obtained, searching an optimal ensemble of row weights and column weights of the low-density parity check code by executing the Gaussian approximation based on a predetermined condition after the row deletion, and dividing at random the row weights and the column weights of the basic matrix after the row deletion based on the optimal ensemble.

According to the present embodiment, first, a coding rate is determined. Next, for example, a "basic matrix based on an integer lattice structure" having constant weights of rows and columns and a minimum number of cycles as 8 is created. The created basic matrix is substituted such that the weights in the matrix are arranged at the top of the columns. An ensemble of irregular-LDPC codes is provisionally searched by Gaussian approximation based on a condition before row deletion. Rows are deleted in order from the bottom of the basic matrix after the permutation by considering the number of rows after a division. An optimal ensemble of irregular-LDPC codes is searched by Gaussian approximation based on a condition after the row deletion. Finally, the weight of the basic matrix after the row deletion is divided at random according to a predetermined procedure based on this ensemble.

BRIEF DESCRIPTION OF THE DRAWINGS

FIG. 4 is a diagram of m classes using a slope s line as a unit;

FIG. 5 is a diagram of an algorithm to design an aggregate that sets 8 as a minimum number of cycles;

FIG. 6 is a diagram of a search result when the algorithm shown in FIG. 5 is executed using $m=5$ and $k=3$;

FIG. 7 is a diagram of one example of a basic matrix;

FIG. 8 is a diagram of a search result when the algorithm shown in FIG. 5 is executed using $m=353$ and $k=10$;

FIG. 9 is a diagram of an algorithm of permutation (rearrangement) of a basic matrix;

FIG. 10 is a diagram of one example of a basic matrix after a permutation;

FIG. 11 is a diagram of a final ensemble of a generator function $\lambda(x)$ and a generator function $\rho(x)$;

FIG. 12 is a diagram of a dividing procedure according to a conventional paper;

FIG. 13 is a diagram of a basic random sequence $C(i)$ and permutation patterns of the basic random sequence;

FIG. 14 is a diagram of Latin square sequences $L_{jq}(i)$;

Figures 17, 18:
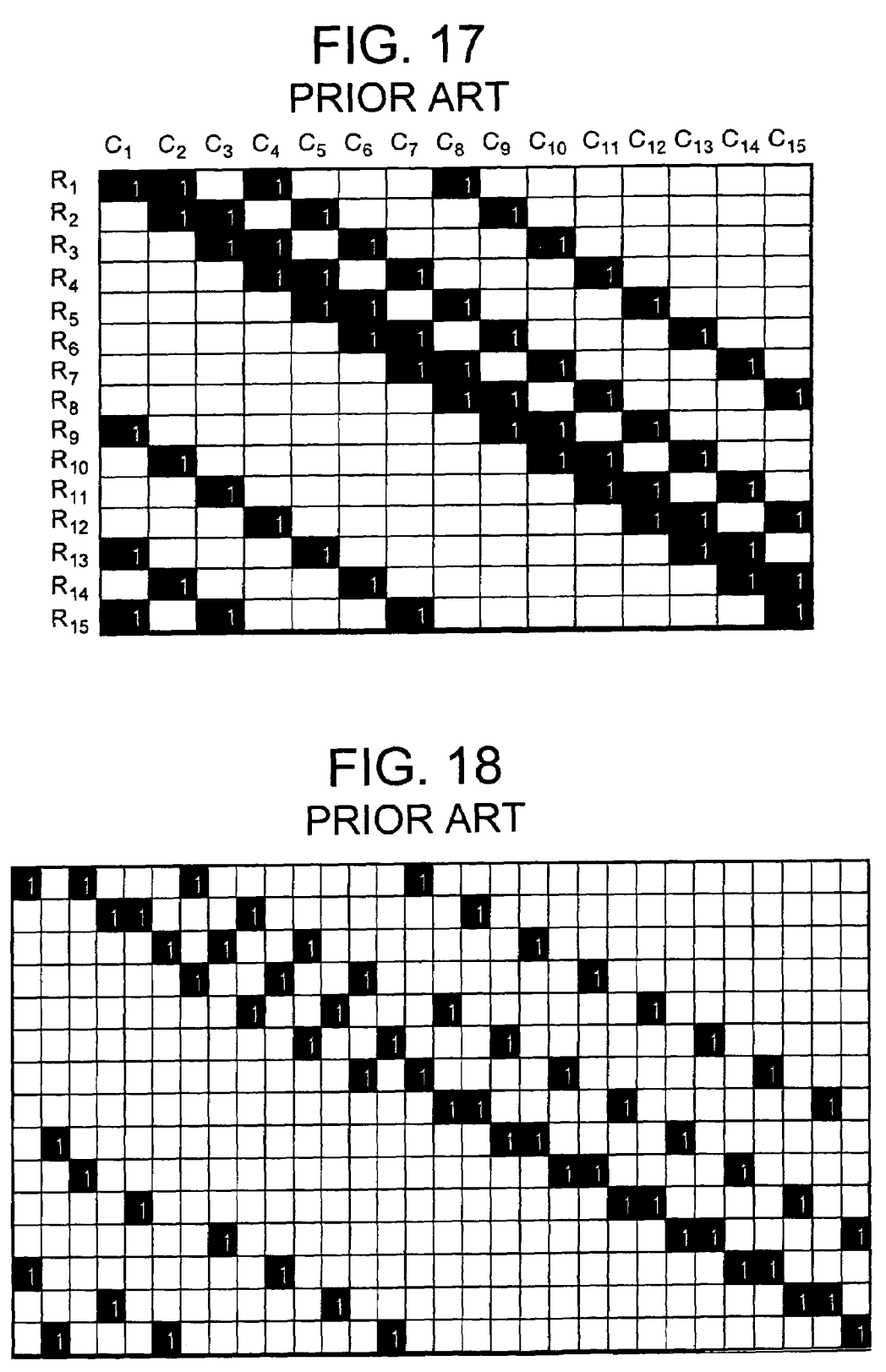

FIG. 17 is a diagram of a configuration of Euclidean geometry codes EG $(2, 2^2)$; and FIG. 18 is a diagram of an exemplary column weight regularly separated from 4 into 2.

BEST MODE FOR CARRYING OUT THE INVENTION

Exemplary embodiments of a method and an apparatus for generating a check matrix according to the present invention will be explained in detail below with reference to the accompanying drawings. It should be noted that the embodiments are not intended to limit the invention.

Figure 1:
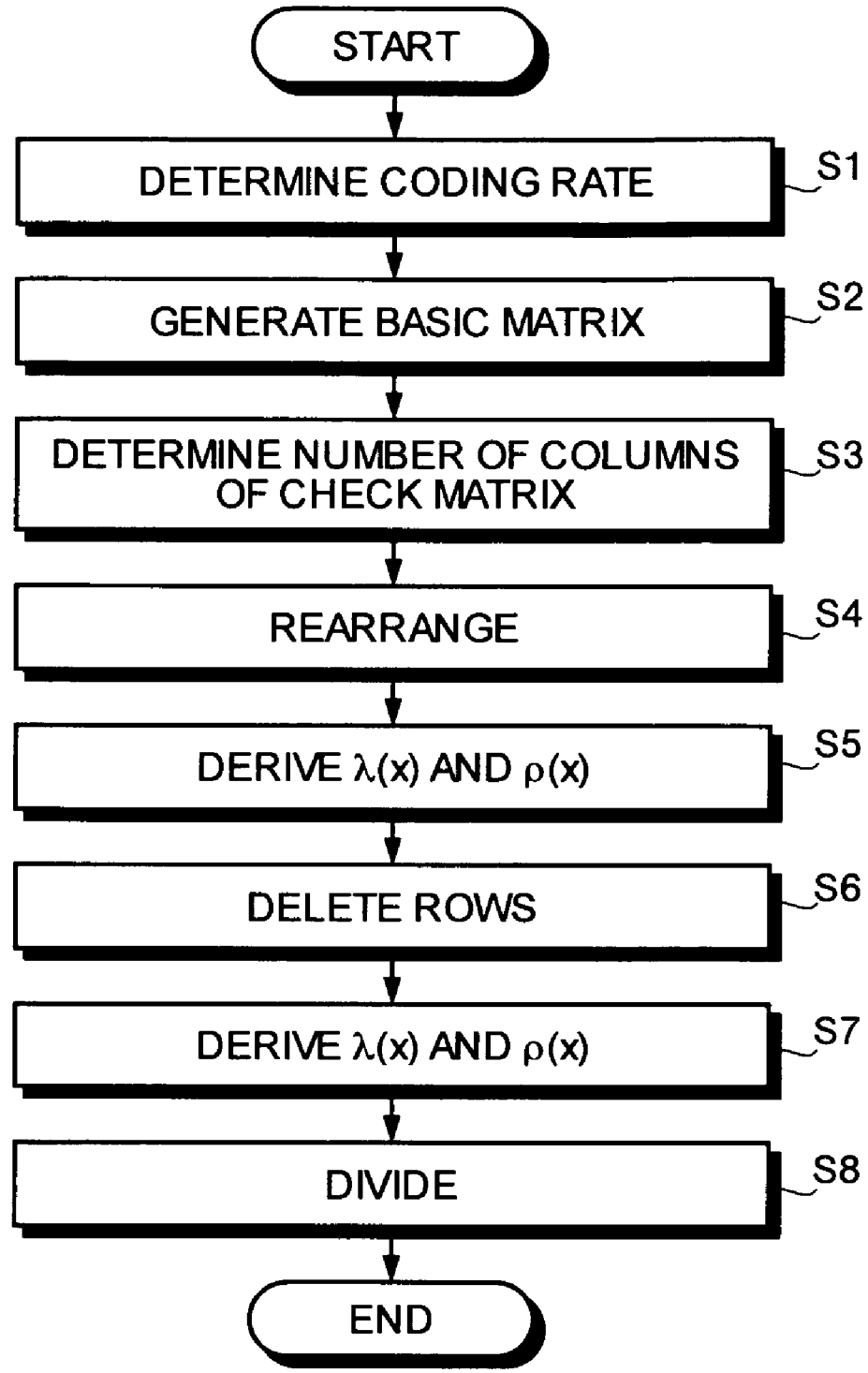
FIG. 1 is a flowchart of a method of generating check matrixes for LDPC-codes according to the present invention.

FIG. 1 is a flowchart of a method of generating check matrixes for LDPC codes according to the present invention. The method of, generating check matrixes for LDPC codes according to the present embodiment may be executed within a communication apparatus according to set parameters, or may be executed within other control unit (such as a computer) outside of the communication apparatus. When the method of generating check matrixes for LDPC codes according to the present embodiment is executed at the outside of the communication apparatus, generated check matrixes for LDPC codes are stored within the communication apparatus. In the following embodiment, the above method is executed within the communication apparatus for the sake of explanation.

Prior to explanation of the method of generating check matrixes for LDPC codes according to the present embodiment, the positions of an encoder and a decoder capable of achieving the method are explained first together with the conventional method of generating check matrixes for "irregular-LDPC codes".

Figure 2:
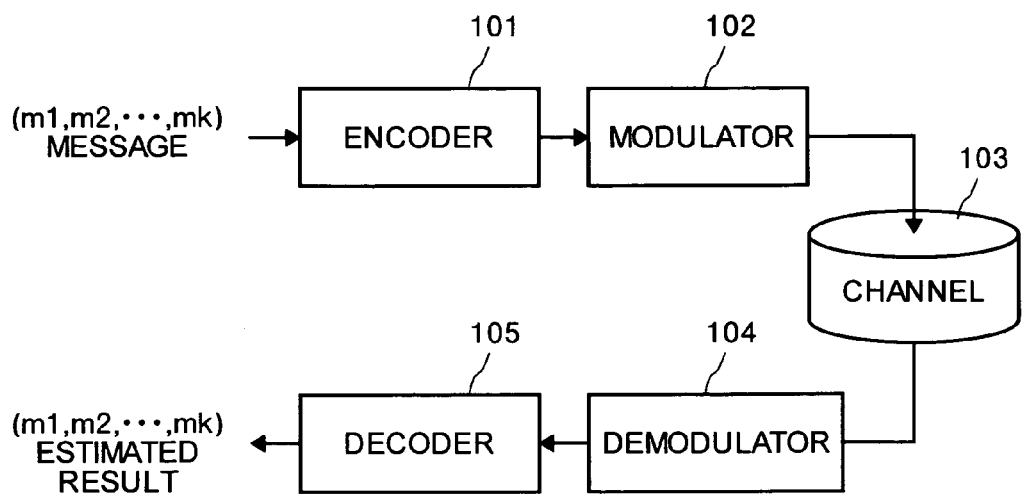
FIG. 2 is a diagram of an LDPC encoding/decoding system.

FIG. 2 is a diagram of an LDPC encoding/decoding system. In FIG. 2, a communication apparatus at a sending side includes an encoder 101 and a modulator 102, and a communication apparatus at a receiving side includes a demodulator 104 and a decoder 105. Flows of encoding and decoding using LDPC codes will be explained below.

At the sending side, the encoder 101 generates a check matrix H using the method of generating check matrixes for LDPC codes according to the present embodiment described later. Then, a generator matrix G is derived from the following condition.

G: k×n matrix (k: information length, n: code word length)

$GH^T=0$ (T denotes transposition)

The encoder 101 then receives a message ($m_1$ $m_2$ ... $m_k$) of an information length k, and generates a code word C using the generator matrix G.

$$C = (m_1 m_2 ... m_k)G$$
$$= (c_1 c_2 ... c_n)(\text{where } H(c_1 c_2 ... c_n)^T = 0)$$

The modulator 102 subjects the generated code word C to a digital modulation such as BPSK, QPSK, and multi-valued QAM, and sends the modulated signal.

At the receiving side, on the other hand, the demodulator 104 receives the modulated signal via the channel 103, and subjects it to a digital demodulation such as BPSK, QPSK, and multi-valued QAM. The decoder 105 then subjects the LDPC-coded, demodulated result to an iterative decoding by "sum-product algorithm" and provides an estimated result (corresponding to the original $m_1$ $m_2$ ... $m_k$).

The conventional method of generating check matrixes for "irregular-LDPC codes" theoretically analyzed in the fifth literature is explained next in detail. In this case, a "sum-product algorithm" for LDPC codes is analyzed, on the assumption that a log likelihood ratio (LLR) between an input and an output at an iterative decoder can be approximated in a Gaussian distribution, to derive a satisfactory ensemble of row and column weights.

The method of generating check matrixes for LDPC Codes described in the fifth literature, or Gaussian Approximation, has a premise that defines a point of "1" on a row as a variable node and a point of "1" on a column as a check node in the check matrix.

LLR message propagation from a check node to a variable node is analyzed first. The following function (2) is defined on condition that $0<s<\infty$ and $0 \leq t<\infty$. In this case, $s=m_{u0}$ denotes a mean of u0; u0 an LLR associated with a signal received via a channel containing a Gaussian noise of distributed value $\sigma_n^2$; and t an ensemble average of LLR output values at check nodes at the time of certain iteration.

$$f_j(s, t) = \phi^{-1}\left(1 - \left[1 - \sum_{i=2}^{d_l} \lambda_i \phi(s + (i-1)t)\right]^{j-1}\right) \quad (2)$$

$$f(s, t) = \sum_{j=2}^{d_r} \rho_j f_j(s, t)$$

$\lambda_i$ and $\rho_i$ denote ratios of edges belonging to variable nodes and check nodes at a degree of i, respectively. $d_l$ denotes a degree of maximum variable nodes, and $d_r$ a degree of maximum check nodes. $\lambda(x)$ and $\rho(x)$ denote generator functions of degree distribution associated with variable nodes and check nodes, and can be represented by the equations (3) and (4), respectively. (A degree is expressed as the number of "1"s in each row of variable nodes or each column of check nodes).

$$\lambda(x) = \sum_{i=2}^{d_l} \lambda_i x^{i-1} \quad (3)$$

$$\rho(x) = \sum_{i=2}^{d_r} \rho_i x^{i-1} \quad (4)$$

where, $\phi(x)$ is defined as shown in the following equation (5).

$$\phi(x) = \begin{cases} 1 - \frac{1}{\sqrt{4\pi x}} \int_R \tanh\frac{u}{2} \cdot e^{-\frac{(u-x)^2}{4x}} du & \text{if } x > 0 \\ 1 & \text{if } x \leq 0 \end{cases} \quad (5)$$

The equation (2) can be represented equivalently by the following equation (6).

$$t_l = f(s, t_{l-1}) \quad (6)$$

where $t_l$ denotes an ensemble average of LLR output values on check nodes at the time of the l-th iteration.

A condition required for deriving an SNR limit (threshold) that provides an error with a value of 0 includes $t_l(s) \to \infty$ (expressed as $R^+$) when $l \to \infty$. In order to satisfy this condition, it is required to satisfy the following conditional equation (7).

$$t<f(s, t), \text{ all } t \in R^+ \quad (7)$$

LLR message propagation from a variable node to a check node is analyzed next. The following equation (8) is defined on condition that $0<s<\infty$ and $0<r \leq 1$. In this case, r has an initial value $r_0$ of $\phi(s)$.

$$h_i(s, r) = \phi\left(s + (i-1)\sum_{j=2}^{d_r} \rho_j \phi(1 - (1-r)^{j-1})\right) \quad (8)$$

$$h(s, r) = \sum_{i=2}^{d_l} \lambda_i h_i(s, r)$$

The equation (8) can be represented equivalently by the following equation (9).

$$r_l = h(s, r_{l-1}) \quad (9)$$

A condition required for deriving an SNR limit (threshold) that provides an error with a value of 0 includes $r_l(s) \to 0$. In order to satisfy this condition, it is required to satisfy the following conditional equation (10).

$$r > h(s, r), \text{ all } r \in (0, \phi(s)) \quad (10)$$

In the fifth literature, optimal degrees are searched for variable nodes and check nodes using the above equation in the following procedure (Gaussian Approximation).
(1) On the assumption that a generator function $\lambda(x)$ and a Gaussian noise $\sigma_n$ are given, a generator function $\rho(x)$ is used as a variable to search a point that maximizes the equation (1) previously described. A constraint condition associated with this search includes normalization to $\rho(x)=1$ and satisfaction of the equation (7).
(2) On the assumption that a generator function $\rho(x)$ and Gaussian noise $\sigma_n$ are given (as a value resulted from the procedure (1), for example), a generator function $\lambda(x)$ is used as a variable to search a point that maximizes the equation (1). A constraint condition associated with this search includes normalization to $\lambda(x)=1$ and satisfaction of the equation (10).
(3) In order to find the maximum "rate", the procedures (1) and (2) are iteratively executed to search a better ensemble of the generator function $\lambda(x)$ and the generator function $\rho(x)$ with a linear programming.
(4) Finally, signal power is normalized to 1 based on Gaussian noise $\sigma_n$ to find an SNR limit (threshold) (see the equation (11)).

$$\text{threshold(dB)} = -10 * \log 10(2 * \sigma_n^2) \quad (11)$$

A problem is found in the fifth literature that a check matrix derived from the maximum of the "rate (coding rate)" is flux, and the rate fixed in design as a specification varies. In addition, in the fifth literature, the derivation of the degree distribution associated with variable nodes and the derivation of the degree distribution associated with check nodes are iteratively executes over certain times. Therefore, a problem arises that it takes time to some extent for searching. Further, a problem arises that the check matrix does not easily apply to an optimal ensemble, an optimal code length, and an optimal coding rate.

In the present embodiment, a method of easily searching in a short time a definite and characteristic-stabilized check matrix for "irregular-LDPC codes", which corresponds to an optimal ensemble, and optimal code length, and an optimal coding rate, is explained (see FIG. 1). Specifically, the check matrix for "irregular-LDPC codes" is generated by using a basic matrix described later (definition: "row and column weights are constant", and "number of cycles is equal to or more than 6").

In the method of generating a check matrix for LDPC codes according to the present embodiment, a coding rate is determined first (step S1). As an example, the coding rate is set to 0.5.

A basic matrix based on an integer lattice structure is created on the assumption of the basic matrix (definition: "row and column weights are constant", and "number of cycles is equal to or more than 6") that is necessary to obtain a check matrix of "irregular-LDPC codes" (step S2). In the coding/decoding using LDPC codes, generally when the number of "cycle 4" and "cycle 6" is as small as possible on a binary graph, satisfactory characteristics can be obtained.

Therefore, LDPC codes having a construction of restricting the occurrence of a small number of "cycle 4" and "cycle 6" is preferable. Therefore, in the present embodiment, a basic matrix using a minimum number of cycles as 8 is created. A procedure of creating a basic matrix (minimum number of cycles as 8) based on an integer lattice structure will be explained. A basic matrix using a Cayley graph, a basic matrix using a Ramanujan graph, or other matrix can be used so long as the basic matrix satisfies the above definition.

The procedure of creating a basic matrix based on an integer lattice structure will be explained.

Figure 3:
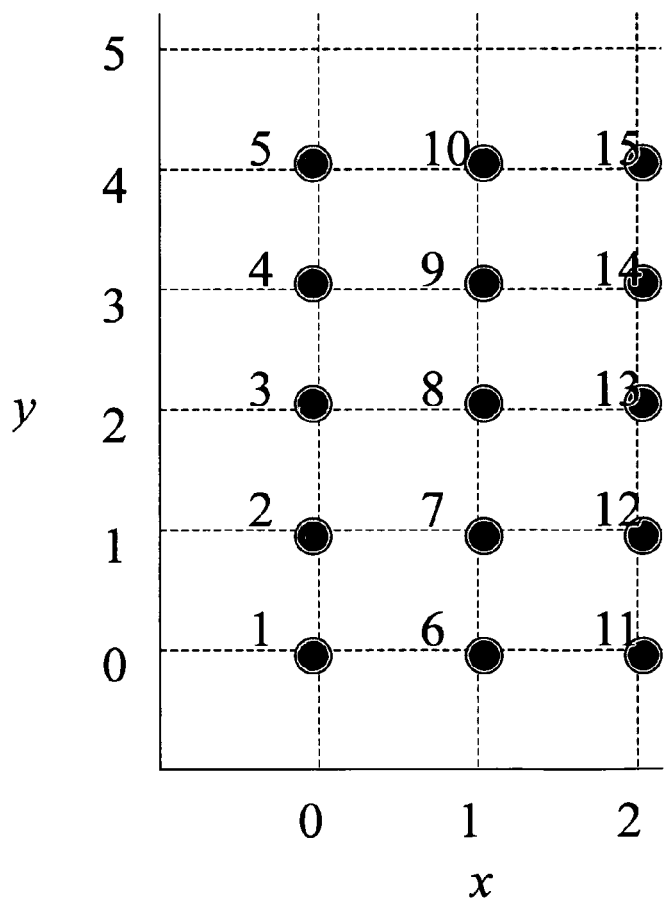
FIG. 3 is a diagram of a lattice structure when $1(x, y) = m \times x + y + 1$, $m=5$, and $k=3$.

(1) First, an aggregate of lines that connect between points (a combination of points) in an integer lattice structure is designed. For example, an aggregate of a lattice structure is set as $L=(x, y)$. In this case, x is an integer of $0 \leq x \leq k-1$, y is an integer of $0 \leq y \leq m-1$, k is an integer, and m is a prime number. $l(x, y)$, is a linear mapping to map the aggregate L to an aggregate V of points. FIG. 3 is a diagram of a lattice structure when $l(x, y)=m \times x + y + 1$, $m=5$, and $k=3$. In FIG. 3, a combination of points that satisfies a certain condition is called a line (block). For example, a line having a slope s ($0 \leq s \leq m-1$) consists of a line of $l(x, a+sx \mod m)$ having a point $(0, a)$ as a starting point, where a is $0 \leq a \leq m-1$. As a result, m classes having the line of the slope s as a unit are created. FIG. 4 is a diagram of m classes having the line of the slope s as a unit.

(2) An aggregate having a minimum number of cycles as 8 is designed based on the algorithm shown in FIG. 5. In other words, a number of columns, a number of rows, weight of columns, and weight of rows are searched. In FIG. 5, S denotes an aggregate of s, and B(s) denotes an aggregate of a class corresponding to the slope s.

FIG. 6 is a diagram of a search result when the above algorithm is executed using $m=5$, and $k=3$. $N=|B|$ denotes a number of columns in the basic matrix, $M=|V|$ denotes a number of rows in the basic matrix, $d_c$ denotes weight of rows in the basic matrix, and $d_v$ denotes a number of columns in the basic matrix. FIG. 7 is a diagram of an execution result of the above algorithm, that is, a basic matrix.

The basic matrix needs to be designed in a relatively large size in order to realize a division of rows and columns described later. When the above algorithm is executed using $k=10$ and $m=353$, a search result shown in FIG. 8 is obtained. When $d_v=10$ and $d_c=7$ as shown in FIG. 8, a divide processing described later can be carried out. In the present embodiment, the processing at step S2 is executed to make firm a number of columns N (=2471) in the basic matrix based on the integer lattice structure and a number of rows M (=3530) in the basic matrix based on the integer lattice structure.

Next, a number of columns N' of a check matrix (a check matrix of "irregular-LDPC codes") finally obtained is determined (step S3). At this point, a number of rows M' of the check matrix of "irregular-LDPC codes" is determined as $M'=N' \times (1\text{rate})$. For example, when $N'=6000$ and rate=0.5, M' is determined as $M'=6000 \times 0.5=3000$.

Next, the basic matrix created above is rearranged according to an algorithm shown in FIG. 9 such that Is are located at higher positions in the columns (step S4). FIG. 9 is a diagram of the algorithm of permutation (rearrangement) of the basic matrix. FIG. 10 is a diagram of one example of a basic matrix after a permutation. The basic matrix when $k=3$ and $m=5$ shown in FIG. 7 is rearranged according to the algorithm shown in FIG. 9. Based on this permutation, columns of large weight can be left as far as possible and a variation in the weight within columns can be reduced as far as possible, in delete processing described later.

Next, an ensemble (degree distribution) of "irregular-LDPC codes" based on a requested coding rate is provisionally obtained using optimization by Gaussian approximation (step S5). In this case, $\gamma_i$ (i=1, 2, . . . , max, $2 \leq \gamma_1 < \gamma_2 < \ldots < \gamma_{max}$) denotes a column weight, $\mu$ and $\mu+1$ ($2 \leq \mu \leq d_c-1$) denote row weights, $d_c$ denotes a weight of a basic matrix, $\lambda\_\gamma_i$ ($0 \leq \lambda\_\gamma_i \leq 1$) denotes a ratio of an edge that belongs to the column weight $\gamma_i$, $\rho\_\mu$ and $\rho\_(\mu+1)$ ($0 \leq "\rho\_\mu, \rho\_(\mu+1)" \leq 1$) denote ratios of an edge belonging to the row weights $\mu$ and $\mu+1$, $b\_\mu$ and $b\_(\mu+1)$ denote nonnegative integers, 80 (x) denotes a generator function of a column weight distribution, $\rho(x)$ denotes a generator function of a row weight distribution, $n\_\mu$ and $n\_(\mu+1)$ denote numbers of rows of the row weights $\mu$ and $\mu+1$, and $n\_\gamma_i$ denotes a number of columns of the column weight $\gamma_i$. The above $\lambda(x)$ and $\rho(x)$ are defined by the equation (13).

$$\rho(x) = \rho\_\mu \times x^{\mu-1} + (1 - \rho\_\mu) \times x^\mu \quad (12)$$
$$b\_\mu \times \mu + b\_(\mu+1) \times (\mu+1) = d_c$$

$$\rho\_\mu_i = \frac{\mu \times b\_\mu}{d_c} \quad (13)$$
$$\rho\_(\mu+1_i) = \frac{(\mu+1) \times b\_(\mu+1)}{d_c}$$

The execution procedure of Gaussian approximation according to the present embodiment to search an ensemble of the generator function $\lambda(x)$ of a column weight distribution and the generator function $\rho(x)$ of a row weight distribution will be explained.

(1) A coding rate "rate" is fixed (step S1).

(2) A generator function $\lambda(x)$ and a generator function $\rho(x)$ are simultaneously used as variables, and a linear programming is employed to search optimal generator functions $\lambda(x)$ and $\rho(x)$ that can maximize Gaussian noise $\sigma_n$ (see the following equation (14)). A constraint condition associated with this search is to satisfy the equation (18) described later.

$$h_i(s, r) = \phi\left(s + (i-1) \sum_{j=2}^{\mu_{max}} \rho_j \phi^{-1}(1 - (1-r)^{j-1})\right) \quad (14)$$

$$h(s, r) = \sum_{i=2}^{\gamma_{max}} \lambda_i h_i(s, r)$$

$$\phi(x) = \begin{cases} 1 - \frac{1}{\sqrt{4\pi x}} \int_R \tanh\frac{\mu}{2} \cdot e^{-\frac{(\mu-x)^2}{4x}} d\mu, & \text{if } x > 0 \\ 1, & \text{if } x \leq 0 \end{cases}$$

The above s denotes an average of a log likelihood ratio (LLR) between a binary signal of $\{-1, 1\}$ received as a transmission signal and a signal received through the Gaussian channel, and can be derived from $s = 2/\sigma_n^2$.

As explained above, according to the present embodiment, the generator functions $\lambda(x)$ and $\rho(x)$ that satisfy a predetermined condition are obtained at one-time linear programming. Therefore, it is possible to create a definite and characteristic-stabilized ensemble more easily in a shorter time than it is by the method described in the fifth literature that iteratively executes derivation of the generator functions $\lambda(x)$ and $\rho(x)$ to derive both optimal values.

The number of rows M' (=3000) is obtained after executing the divide processing of rows described later following $b\_\mu$, $b\_(\mu+1)$, $\mu$, and $\mu+1$ obtained at step S5. The number of rows M (=3530) of the basic matrix is obtained. In this case, rows of a number shown in the following equation (15) are deleted in order from the bottom of the basic matrix after the permutation (step S6). In this example, $(3530-3000)/(1+0)= 530$ rows are deleted. A matrix after deleting the rows has a set of row weights as $\{d_1, d_2, \ldots, d_v\}$.

$$\left[\frac{M - M'}{b\_\mu + b\_(\mu+1)}\right] \quad (15)$$

Next, an ensemble (degree distribution) of "irregular-LDPC codes" based on a requested coding rate is obtained using optimization by Gaussian approximation, using the following constraint equations (16), (17), (18), and (19) (step S7). A matrix $\beta = \{2, 3, \ldots, d_v\}$ expressed by $(\beta)_{i,j}$ of the equation (16) represents a matrix of a nonnegative integer $l(\beta) \times L$ that includes all elements satisfying the equation (16). A matrix shown expressed by $(\beta)_{i,j}$ of the equation (17) represents a square matrix of a nonnegative integer $l \times l$.

$$\begin{bmatrix} a(2)_{1,1} & a(2)_{1,2} & \cdots & a(2)_{1,max} \\ a(2)_{2,1} & a(2)_{2,2} & \cdots & a(2)_{2,max} \\ \vdots & \vdots & \ddots & \vdots \\ a(2)_{l(2),1} & a(2)_{l(2),2} & \cdots & a(2)_{l(2),max} \end{bmatrix} \begin{bmatrix} \gamma_1 \\ \gamma_2 \\ \vdots \\ \gamma_{max} \end{bmatrix} \begin{bmatrix} 2 \\ 2 \\ \vdots \\ 2 \end{bmatrix} \quad (16)$$

$$\begin{bmatrix} a(3)_{1,1} & a(3)_{1,2} & \cdots & a(3)_{1,max} \\ a(3)_{2,1} & a(3)_{2,2} & \cdots & a(3)_{2,max} \\ \vdots & \vdots & \ddots & \vdots \\ a(3)_{l(3),1} & a(3)_{l(3),2} & \cdots & a(3)_{l(3),max} \end{bmatrix} \begin{bmatrix} \gamma_1 \\ \gamma_2 \\ \vdots \\ \gamma_{max} \end{bmatrix} \begin{bmatrix} 3 \\ 3 \\ \vdots \\ 3 \end{bmatrix}$$

$$\vdots$$

$$\begin{bmatrix} a(dr)_{1,1} & a(dr)_{1,2} & \cdots & a(dr)_{1,max} \\ a(dr)_{2,1} & a(dr)_{2,2} & \cdots & a(dr)_{2,max} \\ \vdots & \vdots & \ddots & \vdots \\ a(dr)_{l(\beta),1} & a(dr)_{l(\beta),2} & \cdots & a(dr)_{l(\beta),max} \end{bmatrix} \begin{bmatrix} \gamma_1 \\ \gamma_2 \\ \vdots \\ \gamma_{max} \end{bmatrix} \begin{bmatrix} d_v \\ d_v \\ \vdots \\ d_v \end{bmatrix}$$

$$\begin{bmatrix} A(\beta)_1 & 0 & 0 & \cdots & 0 \\ 0 & A(\beta)_2 & 0 & \cdots & 0 \\ 0 & 0 & \ddots & \ddots & \vdots \\ \vdots & \vdots & \ddots & \ddots & 0 \\ 0 & \cdots & \cdots & 0 & A(\beta)_l \end{bmatrix} \quad (17)$$

$$\frac{\int_0^1 \rho(x)}{\int_0^1 \lambda(x)} = 1 - \text{rate}$$

$$\lambda(1) = 1, \rho(1) = 1$$

$$r > h(s, r), \text{ all } r \in (0, \phi(s)) \quad (18)$$

$$\sum_{\beta=2}^{d_v} \sum_{i=1}^{l} A(\beta)_i = N'$$

$$n\_\gamma_i = \sum_{\beta=2}^{d_v} \sum_{i=1}^{l} A(\beta)_i \cdot a_{i,j}$$

-continued $$\lambda\_\gamma_i = \frac{\gamma_i \times n\_\gamma_i}{M' \times d_c} \quad (19)$$

$$b\_\mu \times \mu + b\_(\mu+1) \times (\mu+1) = d_c$$

$$n\_\mu = b\_\mu \times M', \, n\_(\mu+1) = b\_(\mu+1) \times M'$$

$$\rho\_\mu = \frac{\mu \times n\_\mu}{M' \times d_c}, \, \rho\_(\mu+1) = \frac{(\mu+1) \times n\_(\mu+1)}{M' \times d_c}$$

FIG. 11 is a diagram of a final ensemble of the generator functions $\lambda(x)$ and $\rho(x)$ obtained at step S7 when the ensemble is adjusted in the above procedure.

Figure 12:
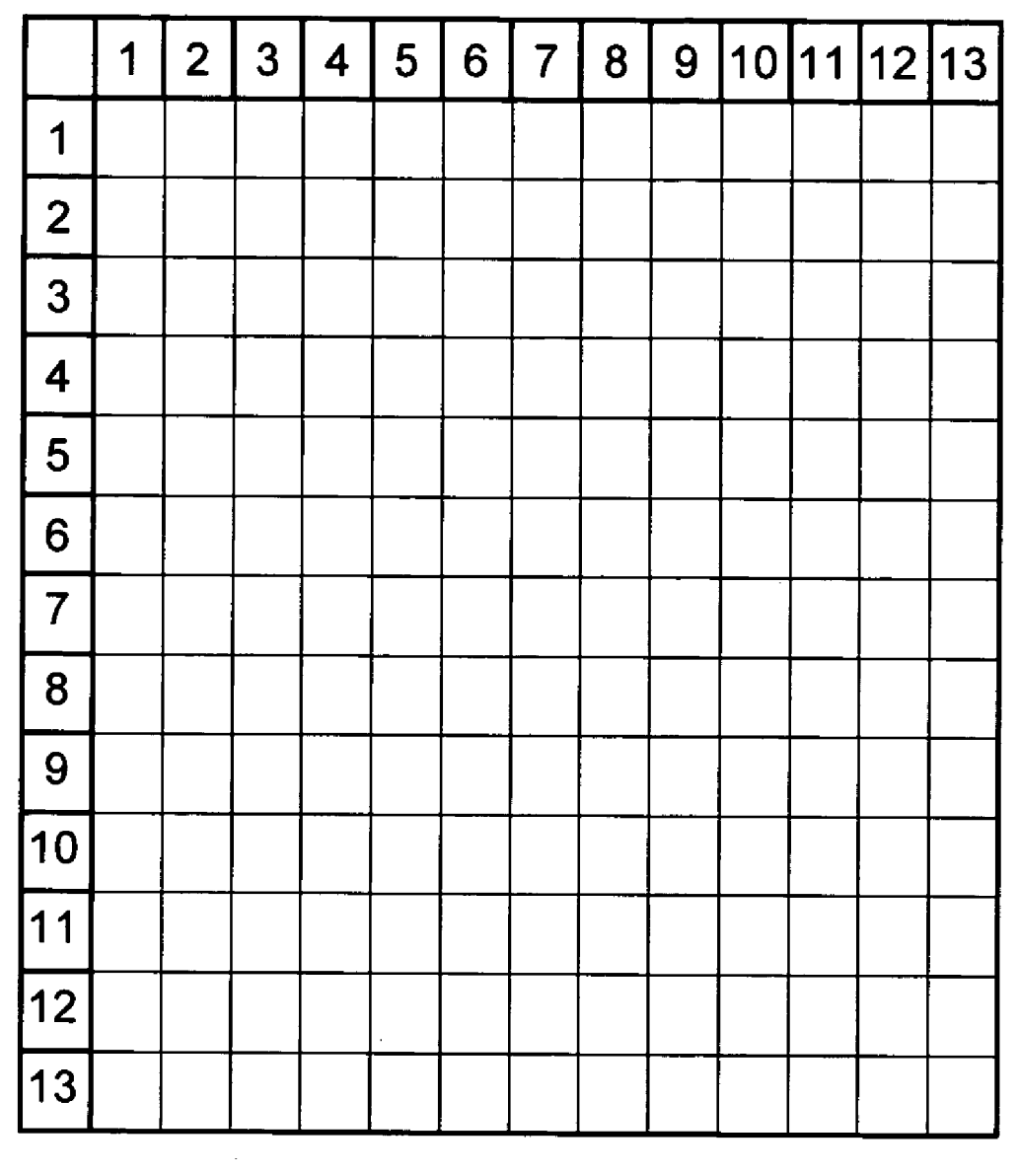

Finally, a dividing procedure of one row or one column in the basic matrix after the permutation (step S8) will be explained. The second literature proposes a regular dividing method concerning the dividing procedure. FIG. 12 is a diagram of the dividing procedure in the literature. First, a matrix is numbered as shown in FIG. 12. In this example, column numbers are given as 1, 2, 3, and so on in order from the left end, and row numbers are given as 1, 2, 3, and so on in order from the top. For dividing 32 points×one column into 8 points×4 columns, for example, this is regularly divided according to the following equation (20).

$$S_m(n) = B_l(m+4*n) \quad (20)$$

In the above equation, m=1, 2, 3, and 4, and n=0, 1, 2, 3, 4, 5, 6, and 7, and l denotes a column number of EG $(2,2^5)$. $B_l(x)$ denotes a position of "1" in an l-th column of EG $(2,2^5)$. $S_m(n)$ denotes a position of "1" in an m-th column of the matrix after the division.

Specifically, a row number that shows a position of "1" in the l-th column of EG $(2,2^5)$ is as follows. $B_1(x)=\{1\ 32\ 114\ 136\ 149\ 223\ 260\ 382\ 402\ 438\ 467\ 507\ 574\ 579\ 588\ 622\ 634\ 637\ 638\ 676\ 717\ 728\ 790\ 851\ 861\ 879\ 947\ 954\ 971\ 977\ 979\ 998\}$. As a result, a row number that shows a position of "1" in the first to fourth columns of the matrix after the division is as follows, based on a regular extraction of the number of "1" from $B_l(x)$.

$$S_1(n)=\{1\ 149\ 402\ 574\ 634\ 717\ 861\ 971\}$$

$$S_2(n)=\{32\ 223\ 438\ 579\ 637\ 728\ 879\ 977\}$$

$$S_3(n)=\{114\ 260\ 467\ 588\ 638\ 790\ 947\ 979\}$$

$$S_4(n)=\{136\ 382\ 507\ 622\ 676\ 851\ 954\ 998\}$$

In other words, 32 points×one column is divided into 8 points×4 columns.

On the other hand, in the divide processing of the basic matrix after the permutation according to the present invention, a regular dividing like the above processing is not executed but the number of "1" is extracted at random from $B_l(x)$ (see a detailed example of a random division described later). Any method of extraction processing can be used so long as randomness is maintained.

When a position of "1" in the m-th column of the matrix after the division is $R_m(n)$, for example, $R_m(n)$ becomes as follows.

$$R_1(n)=\{1\ 114\ 574\ 637\ 851\ 879\ 977\ 979\}$$

$$R_2(n)=\{32\ 136\ 402\ 467\ 588\ 728\ 861\ 971\}$$

$$R_3(n)=\{149\ 260\ 382\ 438\ 579\ 638\ 717\ 998\}$$

$$R_4(n)=\{223\ 507\ 622\ 634\ 676\ 790\ 947\ 954\}$$

One example of a random division, that is, "a division method using a Latin square of random sequences", will be explained in detail. A random sequence to carry out the random division is created easily and definitely. An advantage of this method is that the same random sequence can be created at the sending side and the receiving side. This is extremely important in a real system. This method also has an advantage that a condition of code characteristic can be accurately prescribed.

(1) Creation of basic random sequences:

An example of random sequence creation is described below using Euclidean geometry codes EG $(2,2^5)$ for convenience of explanation. In Euclidean geometry codes EG $(2,2^5)$, the number of "1"s present in a row is equal to $2^5=32$.

When P is used for the minimum prime number that satisfies $P \geq d_v = 2^s$, for example, P=37 in the case of $d_v=2^5$. A basic random sequence C(i) with a sequence length, P−5=32, is created in accordance with the equation (21). $d_v$ denotes a maximum weight of a column. Therefore, when codes other than Euclidean geometry codes are selected as a basic matrix, the use of $d_v$ of this basic matrix makes it possible to apply this division.

$$C(1)=1$$

$$C(i+1)=G_0 \times C(i) \bmod P \quad (21)$$

where, i=0, 1, ..., P−2; and $G_0$ denotes an original source of Galois Field GF(P).

As a result, C(i) is represented by the following equation:

$$C(i)=\{1\ 2\ 4\ 8\ 16\ 32\ 27\ 17\ 34\ 31\ 25\ 13\ 26\ 15\ 30\ 23\ 9\ 18\ 36\ 35\ 33\ 29\ 21\ 5\ 10\ 20\ 36\ 12\ 24\ 11\ 22\ 7\ 14\ 28\ 19\}.$$

(2) Numbers larger than 32 are deleted so as to obtain the sequence length $d_v=2^5=32$.

$$C(i)=\{1\ 2\ 4\ 8\ 16\ 32\ 27\ 17\ 31\ 25\ 13\ 26\ 15\ 30\ 23\ 9\ 18\ 29\ 21\ 5\ 10\ 20\ 3\ 6\ 12\ 24\ 11\ 22\ 7\ 14\ 28\ 19\}$$

(3) A permutation pattern $LB_j(i)$ is created using the following equation (22).

$$j=1, 2, \ldots, d_v$$

$$i=1, 2, \ldots, P-1 \quad (22)$$

Figure 13:
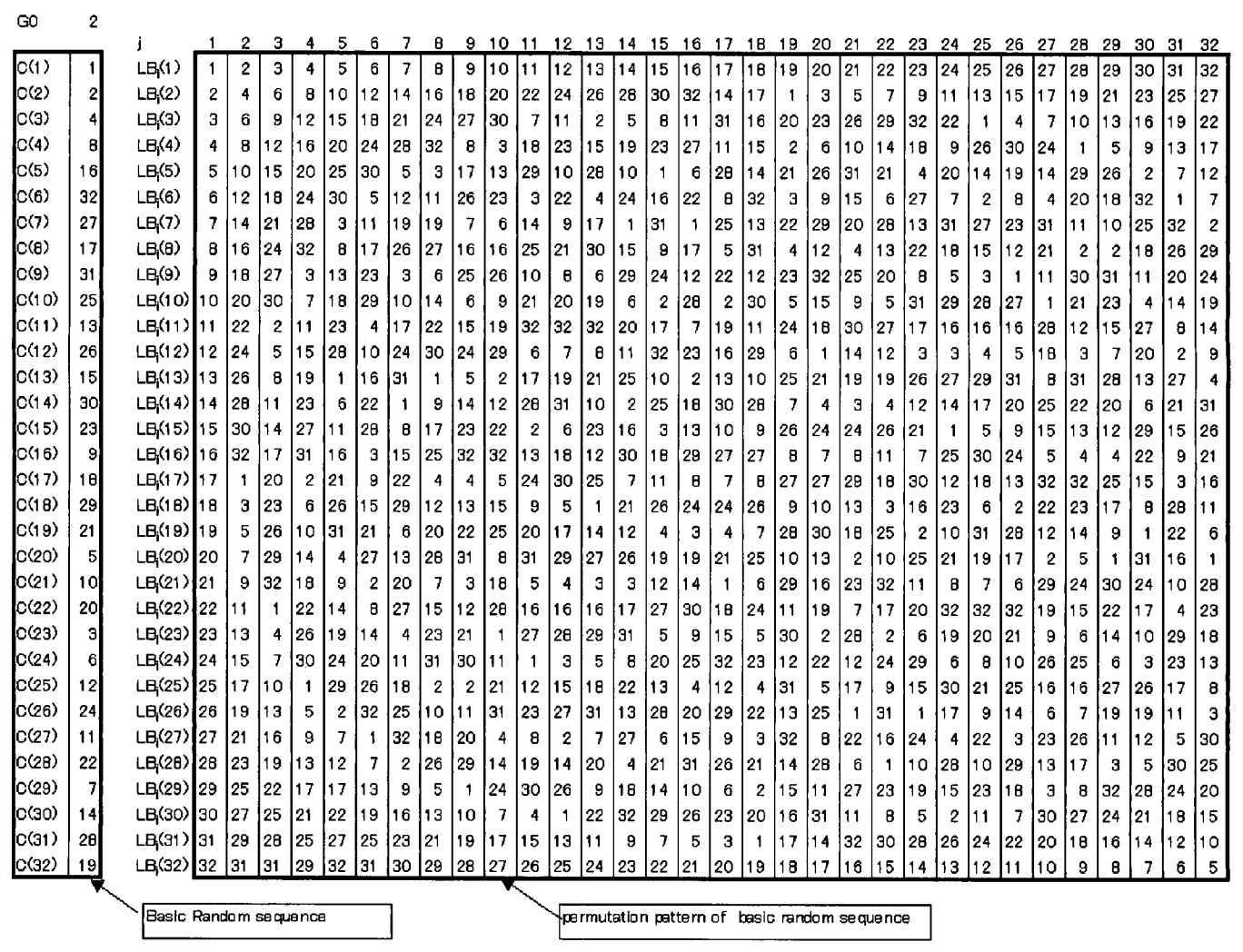

A number larger than $LB_j(i)$ is deleted. FIG. 13 is a diagram of the basic random sequence C(i) and the permutation pattern $LB_j(i)$ of the basic random sequence.

(4) A j-th Latin square matrix $L_{jp}(i)$ in the column q and the row i is calculated from the following equation (23) to execute a division. When the column weight $d\_\beta$ is $d\_\beta < d_v$, numbers larger than $d\_\beta$ are thinned from the elements of $L_{jq}(i)$, based on the delete processing at step S6.

$$L_{jp}(i)=C(LB_j(((q+i-2) \bmod d_v)+1)$$

$$j=1, 2, \ldots, d_v$$

$$i=1, 2, \ldots, d_v$$

$$q=1, 2, \ldots, P-1 \quad (23)$$

Figure 14:
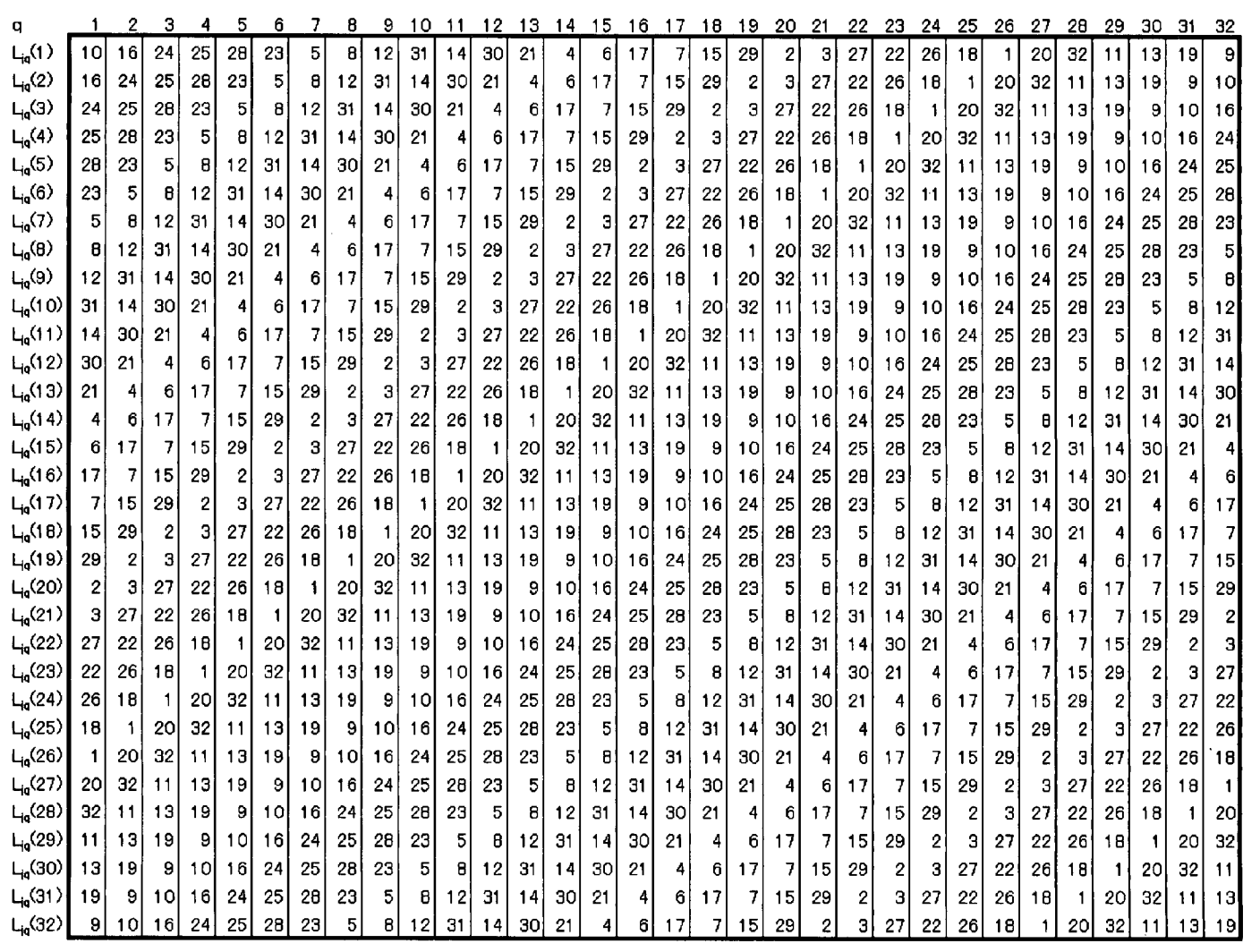

FIG. 14 is a diagram of Latin square sequences $L_{jq}(i)$. The Latin square sequences $L_{jq}(i)$ are used to determine a division pattern of the j×32+q−th column of the matrix to be expanded. For example, the 670-th column $g_{670}(1)$ of EG $(2,2^5)$ to be shortened by deletion is determined as follows:

$g_{670}$ (1)={28 48 84 113 153 220 225 234 268 280
283 284 322 363 374 436 497 507 525 593 600
617 623 625 644 670 701 783 805 818 892
929}.

This is divided into five columns of the weight 6 and one column of the weight 2. The corresponding Latin square $L_{j,q}(i)$ is 20×32+30=670. Therefore, the following Latin square is obtained:

$L_{21,30}$ (1)={13 19 9 10 16 24 25 28 23 5 8 12 31 14
30 21 4 6 17 7 15 29 2 3 27 22 26 18 1 20 32
11}.

As a result, the division pattern becomes as follows:

$g_{670,1}(1) = g_{670}(L_{21,30}(1))$
   = { 322  525  268  280  436  625 } $i$ = 1, 2, ... , 6

$g_{670,2}(1) = g_{670}(L_{21,30}(1))$
   = { 644  783  623  153  234  284 } $i$ = 7, 8, ... , 12

$g_{670,3}(1) = g_{670}(L_{21,30}(1))$
   = { 892  363  818  600  113  220 } $i$ = 13, 14, ... , 16

$g_{670,4}(1) = g_{670}(L_{21,30}(1))$
   = { 497  225  374  805  48  84 } $i$ = 17, 18, ... , 24

$g_{670,5}(1) = g_{670}(L_{21,30}(1))$
   = { 701  617  670  507  28  593 } $i$ = 25, 26, ... , 30

$g_{670,6}(1) = g_{670}(L_{21,30}(1))$
   = { 929  283 } $i$ = 31, 32.

In general, the elements $L_{j,q}(i)$ of Latin square for $g_{c,e}(1)$ are determined based on the following equation (24).

$$j = \lceil c/d_v \rceil$$
$$g = ((c-1) \bmod d_v) + 1 \qquad (24)$$

Figure 15:
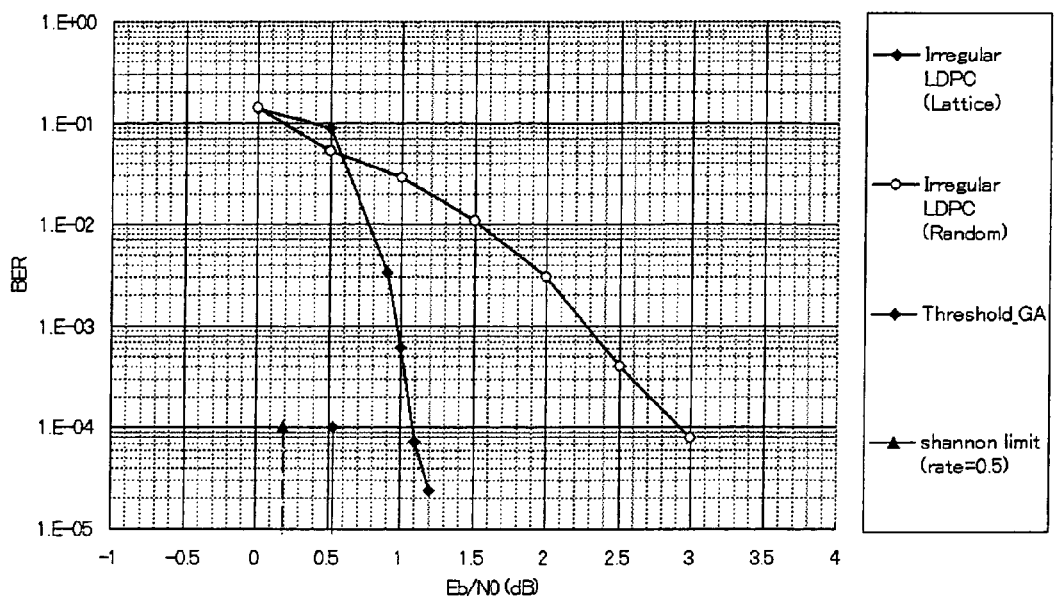
FIG. 15 is a diagram of a relation between an Eb/No and a bit error rate.
Figure 16:
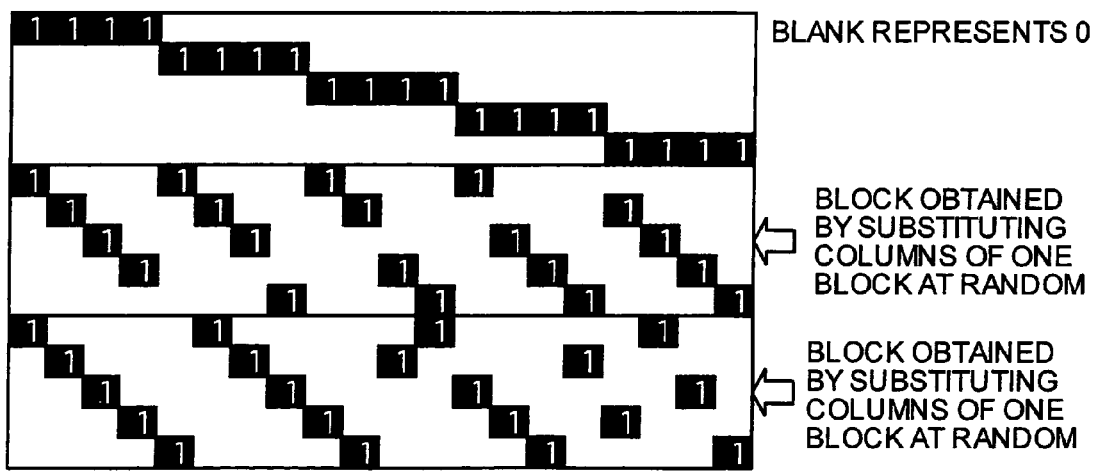
FIG. 16 is a diagram of a conventional check matrix for LDPC codes.

Characteristics of the above LDPC codes will be compared below. FIG. 15 is a diagram of a relation between an Eb/No (a signal power to noise power ratio per one information bit) and a bit error rate (BER). A decoding method is "Sum-Product algorithm". This characteristic uses the ensemble shown in FIG. 11. FIG. 15 is a characteristic comparison between the execution of the regular division as described in the second literature and the execution of the division according to a Latin square of random sequences.

As is clear from FIG. 15, according to the regular division as described in the second literature, a large improvement cannot be expected even with "irregular-LDPC codes". In contrast, the random division of the present embodiment can provide a remarkably improved performance when it is implemented because the probability of the occurrence of a loop decreases substantially.

As explained above, according to the present embodiment, first, a coding rate is determined. Next, a "basic matrix based on an integer lattice structure" having constant weights of rows and columns and a minimum number of cycles as 8 is created. The created basic matrix is substituted based on a specific relational equation. An ensemble of irregular-LDPC codes is provisionally searched by Gaussian approximation based on a condition before row deletion. Rows are deleted in order from the bottom of the basic matrix after the permutation by considering the number of rows after a division. An optimal ensemble of irregular-LDPC codes is searched by Gaussian approximation based on a condition after the row deletion. Finally, the weight of the basic matrix after the row deletion is divided at random according to a predetermined procedure based on this ensemble. With this arrangement, a definite and characteristic-stabilized check matrix for "irregular-LDPC codes" can be generated easily in a short time corresponding to an optional ensemble, an optional code length, and an optional coding rate.

As explained above, according to the present invention, first, a coding rate is determined. Next, a basic matrix having constant weights of rows and columns and a number of cycles equal to or larger than 6 is created. The created basic matrix is substituted based on a specific relational equation. An ensemble of irregular-LDPC codes is provisionally searched by Gaussian approximation based on a condition before row deletion. Rows are deleted in order from the bottom of the basic matrix after the permutation by considering the number of rows after a division. An optimal ensemble of irregular-LDPC codes is searched by Gaussian approximation based on a condition after the row deletion. Finally, the weight of the basic matrix after the row deletion is divided at random according to a predetermined procedure based on this optimal ensemble. With this arrangement, there is an effect that a definite and characteristic-stabilized check matrix for "irregular-LDPC codes" can be generated easily in a short time corresponding to an optional ensemble, an optional code length, and an optional coding rate.

INDUSTRIAL APPLICABILITY

As explained above, the method of generating check matrixes for LDPC codes and the check matrix generating apparatus according to the present invention are useful for the communication system that employs the LDPC codes as error correcting codes. Particularly, the method and the apparatus are suitable for a communication apparatus that searches definite and characteristic-stabilized LDPC codes.

The invention claimed is:

1. A method of generating a check matrix for a low-density parity-check code in which at least one of weights of a column and a row is not uniform, the method comprising:
   determining a coding rate;
   generating a basic matrix that satisfies conditions that weights of rows and columns are constant and number of cycles is equal to or more than six;
   determining number of columns and number of rows of the check matrix to he finally obtained;
   substituting rows of the basic matrix created, based on a specific relational equation;
   searching provisionally an ensemble of row weights and column weights of the low-density parity check code by executing a Gaussian approximation based on a predetermined condition before a row deletion;
   deleting rows of the basic matrix after the substituting in order from a bottom by considering the number of rows of the check matrix to be finally obtained;
   searching a final ensemble of row weights and column weights of the low-density parity check code by executing the Gaussian approximation based on a predetermined condition after the row deletion; and
   dividing at random the row weights and the column weights of the basic matrix after the row deletion based on the final ensemble.

2. The method according to claim 1, wherein a basic matrix is generated based on an integer lattice structure that satisfies conditions that the weights of rows and columns we constant and the minimum number of cycles is eight.

3. The method according to claim 1, wherein the specific relational equation used at the substituting is an equation that can substitute the rows of the basic matrix created such that a weight in a column is placed at a top of the column.

4. The method according to claim 2, wherein the specific relational equation used at the substituting is an equation that can substitute the rows of the basic matrix created such that a weight in a column is placed at a top of the column.

5. The method according to claim 1, wherein, in the Gaussian approximation, an ensemble of optimum row weights and optimum column weights is searched at one time based on a linear programming method in a state of a fixed coding rate, and so as to maximize a Gaussian noise distribution.

6. The method according to claim 2, wherein, in the Gaussian approximation, an ensemble of optimum row weights and optimum column weights is searched at one time based on a linear programming method in a state of a fixed coding rate, and so as to maximize a Gaussian noise distribution.

7. The method according to claim 1, wherein, at the dividing, a Latin square of basic random sequence is generated, and a weight of 1 is extracted from each row and each column in the basic matrix after the row deletion, thereby dividing each column and each row at random based on the Latin square.

8. The method according to claim 2, wherein, at the dividing, a Latin square of basic random sequence is generated, and a weight of 1 is extracted from each row and each column in the basic matrix after the row deletion, thereby dividing each column and each row at random based on the Latin square.

9. The method according to claim 3, wherein, at the dividing, a Latin square of basic random sequence is generated, and a weight of 1 is extracted from each row and each column in the basic matrix after the row deletion, thereby dividing each column and each row at random based on the Latin square.

10. The method according to claim 4, wherein, at the dividing, a Latin square of basic random sequence is generated, and a weight of 1 is extracted from each row and each column in the basic matrix after the row deletion, thereby dividing each column and each row at random based on the Latin square.

11. The method according to claim 5, wherein, at the dividing, a Latin square of basic random sequence is generated, and a weight of 1 is extracted from each row and each column in the basic matrix after the row deletion, thereby dividing each column and each row at random based on the Latin square.

12. The method according to claim 6, wherein, at the dividing, a Latin square of basic random sequence is generated, and a weight of 1 is extracted from each row and each column in the basic matrix after the row deletion, thereby dividing each column and each row at random based on the Latin square.

13. An apparatus for generating a check matrix for a low-density parity-check code in which at least one of weights of a column and a row is not uniform, the apparatus comprising:

a coding-rate determining unit that determines a coding rate;

a basic-matrix generating unit that generates a basic matrix that satisfies conditions that weights of rows and columns are constant and number of cycles is equal to or more than six;

a substituting unit that substitutes rows of the basic matrix created, based on a specific relational equation;

a first weight searching unit that searches provisionally an ensemble of row weights and column weights of the low-density parity check code by executing a Gaussian approximation based on a predetermined condition before a row deletion;

a row deleting unit that deletes rows of the basic matrix after the substituting in order from a bottom by considering the number of rows of the check matrix to be finally obtained;

a second searching unit that searches an final ensemble of row weights and column weights of the low-density parity check code by executing the Gaussian approximation based on a predetermined condition after the row deletion; and a dividing unit that divides at random the row weights and the column weights of the basic matrix after the row deletion based on the final ensemble.

* * * * *